United States Patent [19]
Tilton et al.

[11] Patent Number: 6,108,201
[45] Date of Patent: Aug. 22, 2000

[54] FLUID CONTROL APPARATUS AND METHOD FOR SPRAY COOLING

[76] Inventors: Charles L Tilton, P.O. Box 8, Colton, Wash. 99113; Jeffery K Weiler, 625 NW. Charlotte St., Pullman, Wash. 99163; Donald E Tilton, 14402 SR 195, Colton, Wash. 99113

[21] Appl. No.: 09/255,415

[22] Filed: Feb. 22, 1999

[51] Int. Cl.$^7$ ...................................................... H05K 7/20
[52] U.S. Cl. ......................... 361/689; 361/698; 361/699; 361/719; 257/714; 174/15.1; 165/80.4; 165/104.33
[58] Field of Search .................................... 361/689, 698, 361/699, 704, 677; 257/714, 716; 174/15.1; 165/80.4, 104.35, 104.34

[56] References Cited

U.S. PATENT DOCUMENTS

| | | | |
|---|---|---|---|
| 5,412,536 | 5/1995 | Anderson et al. | 361/700 |
| 5,731,542 | 3/1998 | Limper-Brenner et al. | 174/52.4 |
| 5,768,103 | 6/1998 | Kobrinetz et al. | 361/699 |
| 5,907,473 | 5/1999 | Przilas et al. | 361/699 |
| 5,943,211 | 8/1999 | Havey et al. | 361/699 |

*Primary Examiner*—Leo P. Picard
*Assistant Examiner*—Boris L. Chervinsky
*Attorney, Agent, or Firm*—David S. Thompson

[57] ABSTRACT

A fluid control apparatus is adapted for use with a spray plate 100 having at least one atomizer 120 which cools an associated printed circuit board 200 carrying one or more heat-generating components such as integrated circuits 220. At least one spray plate and printed circuit board are carried within a coolant-tight enclosure such as a spray module 300. A preferred shroud 20 is supported by the spray plate. The shroud encloses a spray cavity 24 and provides control over the flow and direction of the spray coolant leaving the atomizers enclosed by the shroud. Control over the flow and direction of the coolant spray better cools the components carried on the printed circuit board and partially enclosed by the shroud.

4 Claims, 5 Drawing Sheets

FLUID CONTROL APPARATUS AND METHOD FOR SPRAY COOLING

CROSS-REFERENCES

This application is related to application Ser. No. 09/044841, filed Mar. 20, 1998.

BACKGROUND

Efficient and cost effective spray cooling of electronic assemblies requires high-density system packaging. However, the density of the design leads to heat removal problems caused by liquid and vapor leaving the surfaces of integrated circuits (chips) interfering with and disrupting the sprays which are directed at the surfaces of the same and other chips. Liquid and vapor leaving one chip can cause poor heat-transfer performance in adjacent chips. This is particularly likely to occur in the very common circumstance where a high-powered chip, requiring a large volume flux of spray, is adjacent to one or more lower-powered chips requiring less spray volume. Fluid coating the high-powered chip's surface absorbs heat and leaves as a mixture of liquid and gaseous vapor. The volume and velocity of this fluid movement can be considerable, and due to lack of control over its direction and movement, it is particularly likely that it will interfere with the spray directed at adjacent chips. This interference can cause flooding of the device which inhibits thin film evaporation, thereby reducing the heat transfer performance. This can result in overheating of these adjacent chips.

One possible solution is to increase the spray volume directed at lower-power chips. This solution is flawed for several reasons. First, excess coolant carried on the surface of the lower-powered chips can actually reduce the quantity of coolant which undergoes a heat-absorbing phase-change. Where more than a thin film is used to cover a heat generating component the rate of heat transfer is reduced. Secondly, the cumulative effect of an increased spray volume directed by several spray nozzles at several low-powered chips surrounding a high-power chip could result in undesired changes in the spray pattern directed at the high-powered chip. Thirdly, excessive spray requirements necessarily result in a requirement of greater pump capacity, overall greater coolant supply and an associated increase in costs. And finally, since the overall heat produced by the entire system can result in the vaporization of only a fixed quantity of liquid coolant, significantly exceeding that level of coolant supplied will result in a significant excess quantity of liquid coolant. In some applications, the spray module may tend to fill up with liquid. If this coolant is not properly directed, it could swamp chips in its flow pathway, thereby covering such chips with more than the optimal quantity of coolant for maximum efficiency in heat transfer.

A similar possible solution is to employ overlapping sprays to suppress the interference effect. However, in most applications the chips are not spaced in a manner that supports this strategy without unduly increasing the system flow rate requirements resulting in the above problems.

A further possible solution to the problem of interference between the spray directed at adjacent chips is to design the board in a manner in which minimization of this phenomena is a design parameter. However, this significantly increases design costs. More troubling still, it is possible that no arrangement of the chips on the board may result in a satisfactory design in many applications. Also, the design engineer and board layout technician may not be well-versed in thermal issues, and may be unable to achieve satisfactory results.

For the foregoing reasons, there is a need for a fluid control apparatus and method of use that can result in enhanced control over the direction and distribution of spray coolant in a manner that reduces or eliminates the interference caused by spray directed at a first chip with the spray and cooling process of a second chip.

SUMMARY

The present invention is directed to an apparatus that satisfies the above needs. A novel fluid control apparatus and method of use for controlling spray cooling is disclosed. The fluid control apparatus for spray cooling of the present invention is adapted for support between a spray plate and a printed circuit board, whereby it may substantially enclose a component to be cooled, and includes some or all of the following structures.

(A) A preferred shroud includes a sidewall defining a spray cavity sized to enclose at least one generally conical spray of coolant mist discharged by the spray orifice of at least one atomizer defined on the surface of the spray plate.

(B) An inlet passage, defined in a portion of the sidewall adjacent to the spray plate, allows vapor to enter the spray cavity for movement generally in the direction of the spray of coolant mist.

(C) An effluent passage, defined in a portion of the sidewall adjacent to the printed circuit board, allows coolant to leave the spray cavity.

(D) Fastening means, carried by the shroud, maintains the shroud in position between the spray plate and printed circuit board or other device carrier, and may be adhesive or other type fastener. The shroud may be attached to either the spray plate to the printed circuit board, or to a chip carrier assembly of a large-scale integrated circuit.

It is therefore a primary advantage of the present invention to provide a novel fluid control apparatus and method for spray cooling that provides a solution to heat-transfer problems caused by coolant flow disruption resulting from interference caused by adjacent atomizers.

Another advantage of the present invention is to provide a novel fluid control apparatus and method for spray cooling that does not utilize excessive coolant volume or depend on overlapping spray patterns to correct disruption in spray patterns due to interference between adjacent atomizers.

A still further advantage of the present invention is to provide a novel fluid control apparatus and method for spray cooling that reduces undesired coolant flow interactions by providing a combination of shrouding and fluid return passages within the spray module.

DRAWINGS

These and other features, aspects, and advantages of the present invention will become better understood with regard to the following description, appended claims, and accompanying drawings where:

DESCRIPTION

Figure 1:
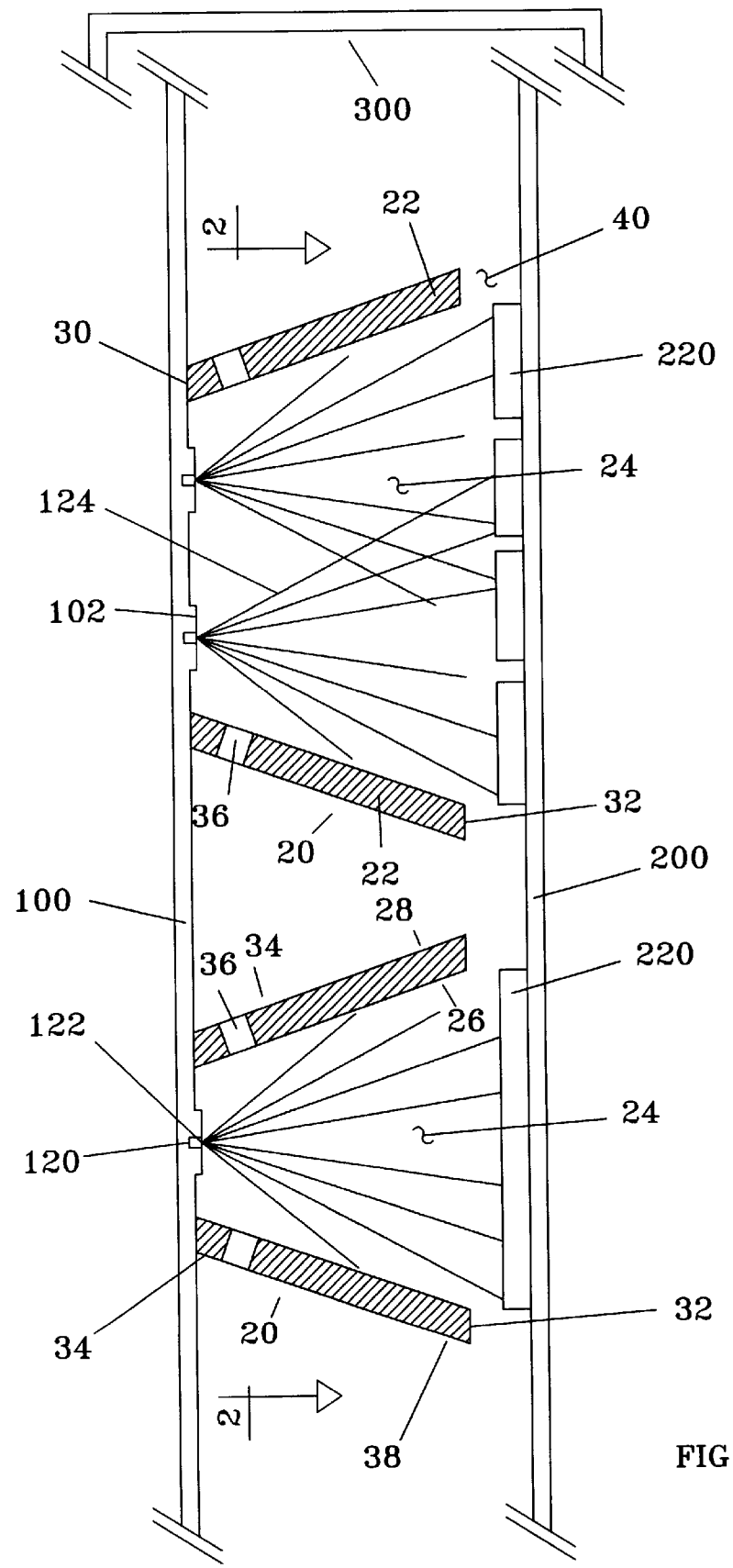
FIG. 1 is a side cross-sectional view of a spray plate carrying a version of the shroud of the invention and a printed circuit board supporting several integrated circuits.
Figure 2:
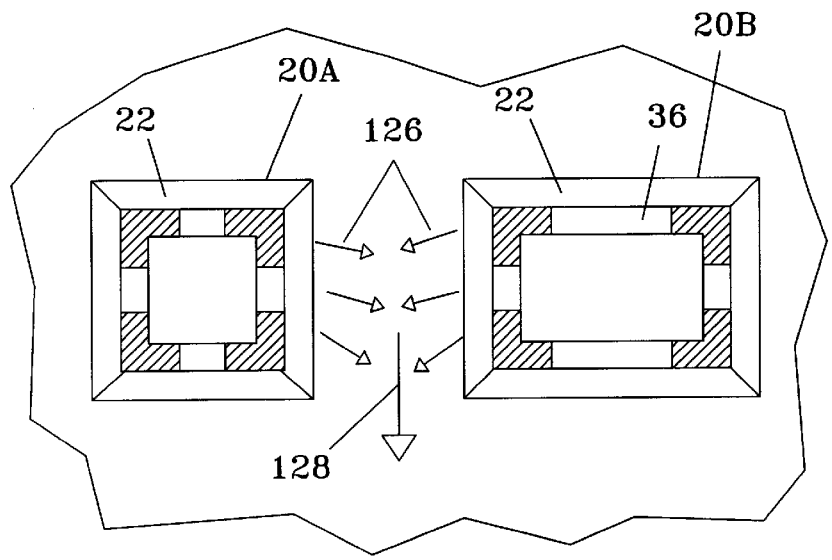
FIG. 2 is one version of a vertical cross-sectional view of the spray plate and shroud of FIG. 1 having a generally rectilinear configuration, taken along the 2—2 lines of FIG. 1.
Figure 3:
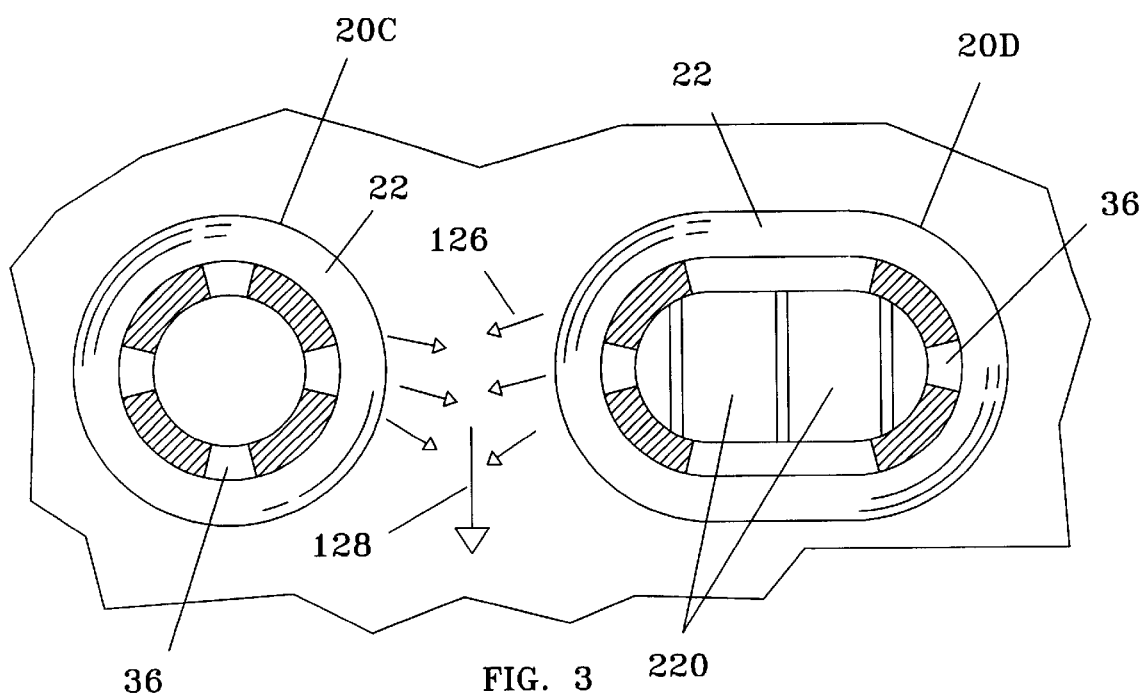
FIG. 3 is an alternate version of the vertical cross-sectional view of FIG. 2, having a rounded configuration.

Referring generally to FIGS. 1 through 3, a first version of a fluid control shroud 20 adapted for use in spray cooling constructed in accordance with the principles of the invention is seen. The fluid control apparatus is adapted for use with a spray plate 100 having at least one atomizer 120 which cools one or more heat-generating components, such as integrated circuits 220, carried by a printed circuit board 200. At least one spray plate and printed circuit board are carried within a coolant-tight enclosure such as a spray module 300. The fluid control shroud 20 may be supported by the spray plate or by the printed circuit board. The shroud 20 encloses a spray cavity 24 and provides control over the flow and direction of the spray coolant leaving the atomizers enclosed by the shroud. Control over the flow and direction of the coolant spray better cools the components carried on the printed circuit board and partially enclosed by the shroud.

Referring particularly to FIGS. 1 through 3, the spray plate-mounted shroud 20 is seen. As seen in FIG. 1, the shroud is supported by the spray plate 100 and provides sidewalls 22 which define a partially enclosed spray cavity 24. As oriented in FIG. 1, the spray cavity is also bounded on the left by the spray plate 100 and on the right by the printed circuit board 200. The sidewalls 22 enclosing the spray cavity 24 include inner and outer surfaces 26, 28. A portion 34 of the sidewall is adjacent to the spray plate 100, and a portion 38 of the sidewall is adjacent to the printed circuit board 200.

In this embodiment of the shroud, an edge 30 of the sidewall 22 of the shroud 20 is attached to the spray plate 100 by adhesive or other fastening means.

As seen in FIG. 1, an edge 32 of the sidewall 22 adjacent to the printed circuit board is parallel to and a short distance from the printed circuit board 200. The gap between the lower edge 32 of the shroud 20 and the printed circuit board 200 defines an effluent passage 40 which allows coolant and vapor to exit from the spray cavity 24.

One or more inlet passages 36 are defined in the portion 34 of the sidewall adjacent to the spray plate. As seen in FIGS. 1 through 3, the inlet passages 36 of a preferred version are typically narrow slots having a lengthwise component oriented parallel to the spray plate. Alternatively, holes or other openings could be substituted for the slots illustrated. The inlet passages 36 allow the passage of vapor into the spray cavity 24, which tends to promote better directional control over the spray of coolant mist 124 because the vapor relieves the negative pressure gradient caused by the spray.

As seen in FIGS. 2 and 3, four examples of the shape of the shroud 20 are disclosed. Referring to the shroud 20A on the left side of FIG. 2, it is seen that the shroud may be generally conical in shape, having the tip of the cone removed. Referring to the shroud 20B on the right side of FIG. 2, it is seen that the shroud may be oval in shape, with sloping or curved side walls. Referring to the shroud 20C on the left side of FIG. 3, it is seen that the shroud may be pyramid-like in shape, having the upper tip of the pyramid removed. And, referring to the right side of FIG. 3, it is seen that the shroud 20D may be pyramid-like with a rectangular cross-section, also having the tip of the pyramid removed.

As seen in FIG. 1, in a preferred spray plate 100 the atomizer 120 may be defined in an elevated pad 102. In the event that the spray module is oriented so that gravity may cause a slight pooling of coolant fluid, the pad prevents an accumulation of fluid from covering the spray orifice 122 of the atomizer 120.

Figure 4:
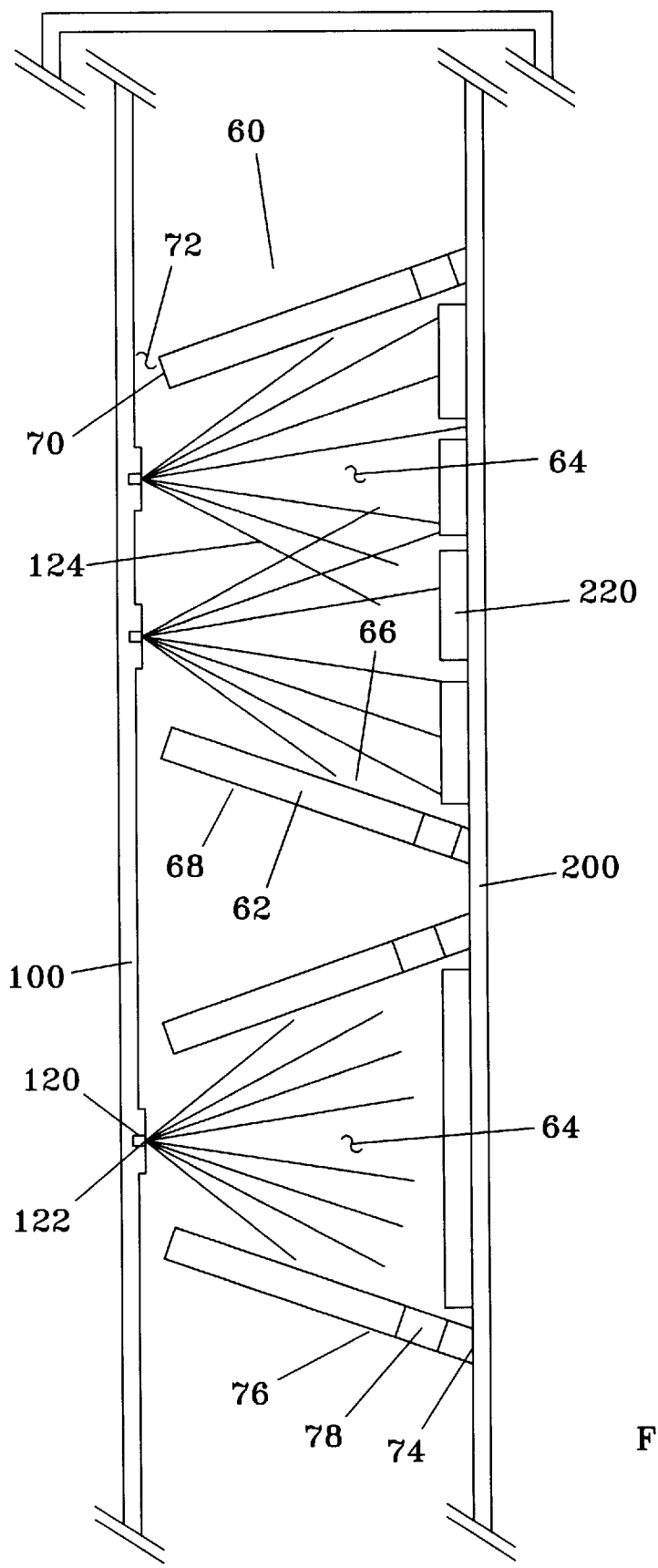
FIG. 4 is a side cross-sectional view of a second version of the shroud carried by a printed circuit board.

Referring to FIG. 4, a version of the shroud supported by the printed circuit board is seen. As illustrated in FIG. 4, the alternate shroud 60 is supported by the printed circuit board 200 and provides sidewalls 62 which define a partially enclosed spray cavity 64. As oriented in FIG. 4, the spray cavity is also bounded on the left by the spray plate 100 and on the right by the printed circuit board 200. The spray cavity is sized to enclose one or more heat-producing components.

The sidewalls 62 enclosing the spray cavity 64 include inner and outer surfaces 66, 68. An edge 70 of the sidewall adjacent to the spray plate is spaced a narrow distance from the spray plate. The space between the edge 70 and the spray plate forms an inlet passage 72 which allows vapor to enter the spray cavity. An edge 74 of the sidewall is connected to the printed circuit board 200 by adhesive or other fastening means.

One or more effluent passages 78 are defined in a portion 76 of the sidewall near the printed circuit board. In a manner similar to the inlet passages of the version of the shroud of FIGS. 1–3, the effluent passages 78 are typically narrow slots having a lengthwise component oriented parallel to the printed circuit board 200. Alternatively, holes or other openings could be substituted for the preferred slots.

Figure 5:
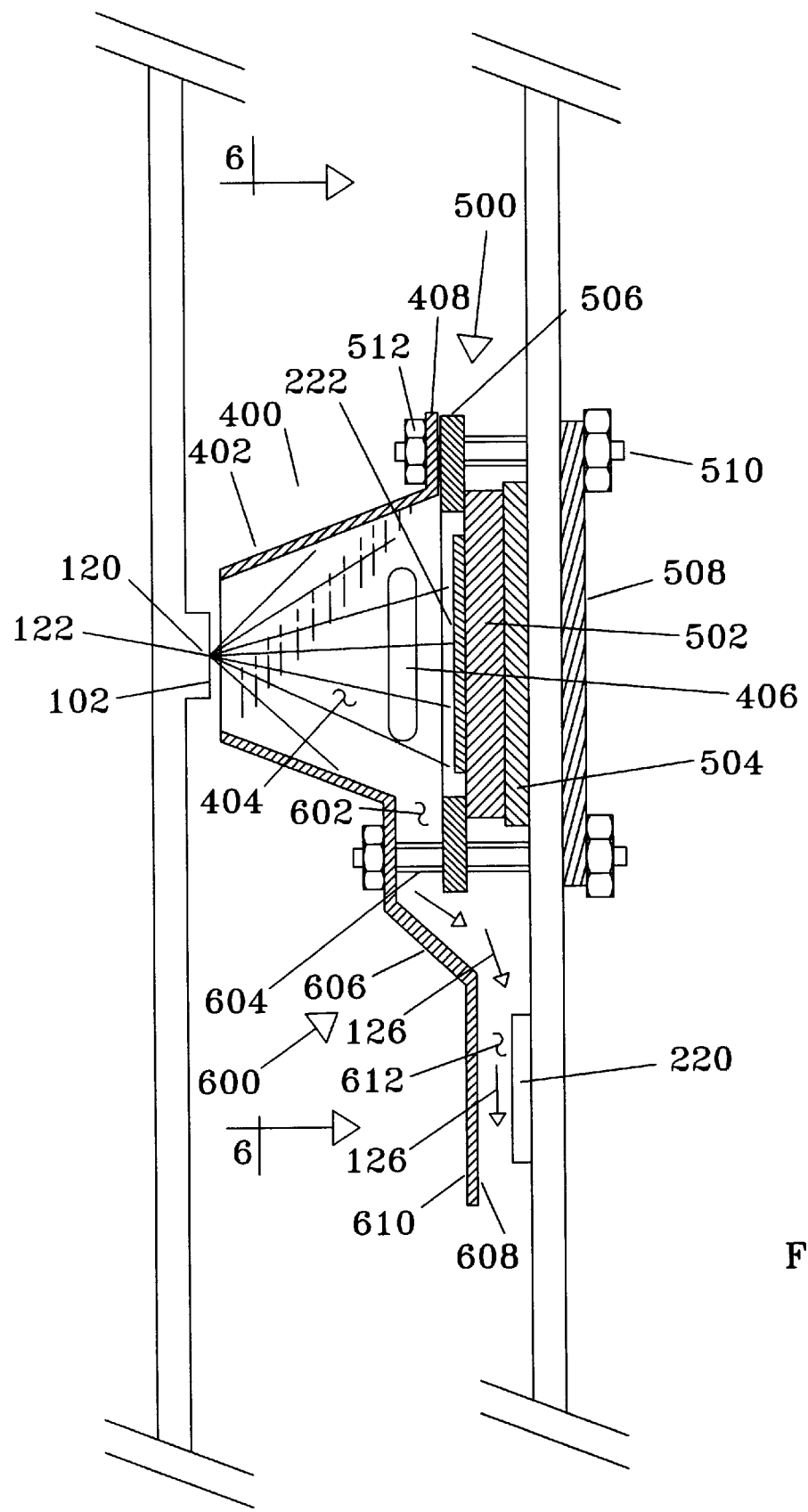
FIG. 5 is a side cross-sectional view of a third version of the shroud, carried adjacent to the chip carrier assembly of a large-scale integrated circuit, and also showing a secondary shroud, extending from the third version of the shroud.
Figure 6:
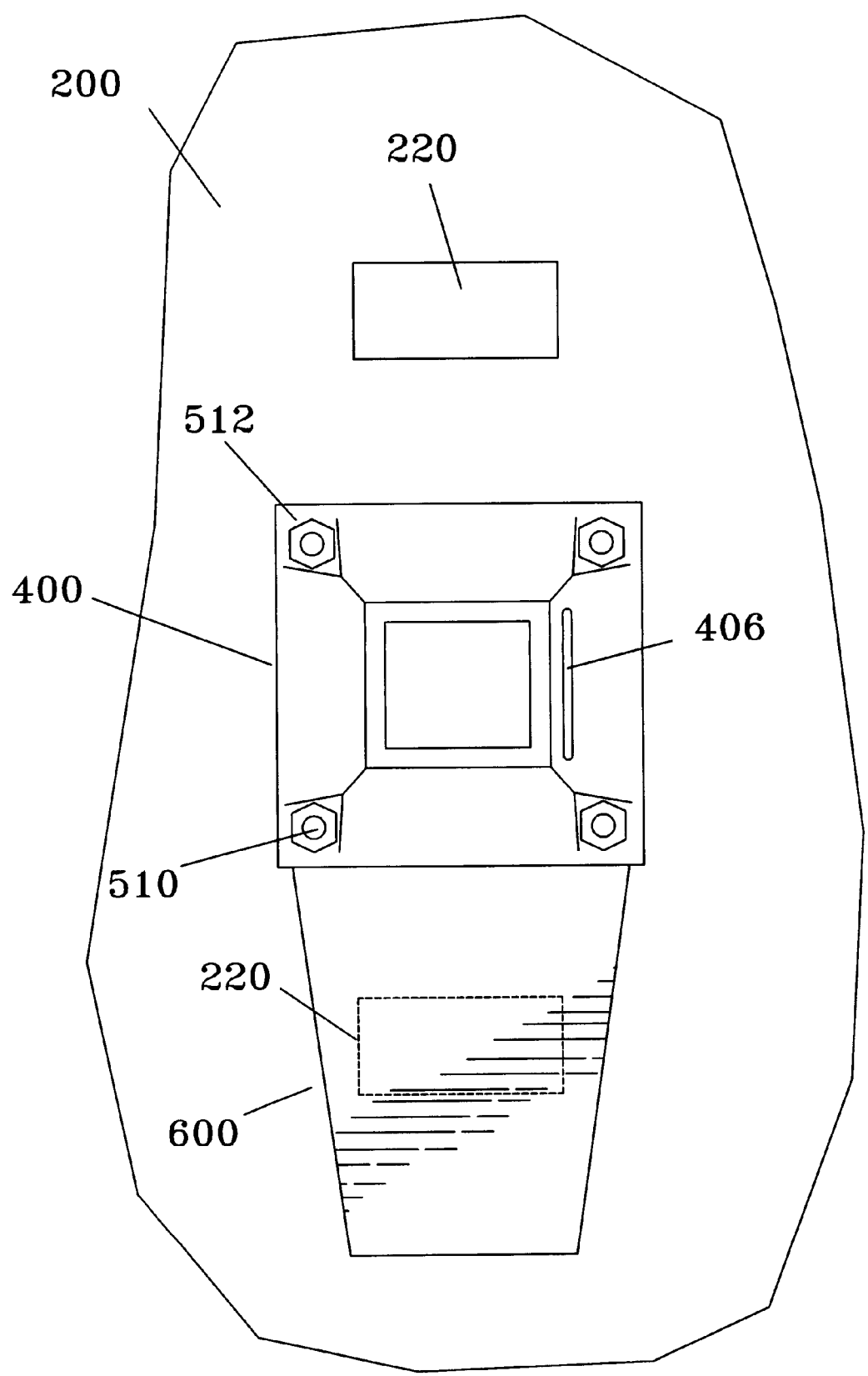
FIG. 6 is a top view of the shroud of FIG. 5.

As seen in FIGS. 5 and 6, a version of the shroud 400 is adapted for support by the chip carrier assembly 500 associated with a very large scale integrated circuit 222, such as a microprocessor. The chip carrier assembly typically includes a chip carrier 502, an I/O interface pad 504, a pressure plate 506, a backing plate 508 and associated hardware. In many applications, a large, high power consuming integrated circuit will be mounted on a chip carrier 502. The chip carrier may be mounted on an I/O interface pad (compliant interconnect) 504, which is in turn carried by a first side of the printed circuit board 200, where electrical connections are made. The chip carrier 502, the interface pad 504 and the printed circuit board are squeezed between a pressure plate plate 506 and a backing plate 508. Typically, the pressure plate contacts a perimeter portion of the chip carrier, located on a first side of the printed circuit board. The backing plate is located on a second side of the printed circuit board opposite the interface pad. Support bolts 510 and associated fasteners such as nuts 512 secure the pressure plate 506 and backing plate 508.

As seen in FIGS. 5 and 6, a version of the chip carrier-mounted shroud 400 directs the spray from one or more spray nozzles onto the surface of a large integrated circuit 222, and is adapted for support by the chip carrier assembly 500. The chip carrier-mounted shroud typically includes a sloping sidewall 402 which encloses a chamber 404 within which the spray of coolant mist 124 from one or more spray orifices 122 is protected from the destructive influence of adjacent atomizers.

The sloping sidewalls define one or more discharge slot openings 406. The discharge openings allow effluent 126 to exit the chamber 404. The size, location and distribution of the discharge openings may be selected with reference to the nature and distribution of adjacent components. Such selection will result in the direction of the effluent 126 in a manner which cools or does not interfere with the cooling of the adjacent components.

A shroud base 408 typically defines holes which may be used to anchor the shroud 400 to the support bolts 510 of the chip carrier assembly 500.

The shroud of FIGS. 1 through 6 can alternatively be mounted on a multi-chip module (MCM) or other component or integrated circuit supporting device. Alternatively, the shroud may be supported or mounted on a flange or bracket extending from the enclosure containing the spray coolant, the card cage supporting the printed circuit boards, MCMs or other component-supporting device, or from any convenient location.

A secondary chip mounted shroud 600 may be carried by the support bolts 510 or may be an integral extension of the chip carrier mounted shroud 400. The secondary shroud directs effluent 126 leaving the chamber 404 through path 612 over adjacent integrate circuits 220 in an orderly manner. In a typical application, the secondary shroud may replace one or more discharge slots 406 as a means of discharging effluent from the chamber 404.

As seen particularly in FIG. 5, a stand-off 604 allows separation of the pressure plate and the shroud, thereby forming a passage 602 between the base of the shroud and the pressure plate, allowing the effluent to pass from the chamber 404 through path 612. A ramp 606 directs the effluent toward the printed circuit board, along a path 612 between the lower surface 608 and the printed circuit board, where the effluent passes by chips 220 adjacent to the large scale integrated circuit 222. Where there is spray coolant mist from nearby atomizers, such mist tends to deflect off the upper surface 610 of the secondary shroud, and does not interfere with the effluent movement 126 as seen in FIG. 5.

In operation, a shroud having a size and shape resulting in a spray cavity sized to enclose one or more high heat-producing components is selected. Isolation of the heat-producing components within the shroud allows for better control over the flow of coolant spray 124 directed at those components and also prevents the spray from interfering with other coolant sprays directed at other components.

As seen in FIG. 1, a spray of coolant mist 124 forms a thin coating on the heat-producing components. The mist tends to spray the entire area of the printed circuit board within the spray cavity 24 and also some of the inside surfaces 26 of the sidewalls 22.

Referring to FIGS. 2 and 3, a high-speed effluent 126, comprising coolant fluid and vapor, exits the spray cavity 24 through the effluent passage 40. A fluid return passage 128 between shrouds 20 and unshrouded components allows the coolant fluid to return to a reservoir where it may be fully condensed and pumped under pressure to the atomizers 120 of the spray plate 100.

The previously described versions of the present invention have many advantages, including a primary advantage of providing a novel fluid control apparatus and method for spray cooling that solves heat-transfer problems caused by coolant flow disruption resulting from interference caused by adjacent atomizers.

Another advantage of the present invention is to provide a novel fluid control apparatus and method for spray cooling that does not utilize excessive coolant volume or depend on overlapping spray patterns between chips to correct disruption in spray patterns due to interference between adjacent atomizers.

A still further advantage of the present invention is to provide a novel fluid control apparatus and method for spray cooling that reduces undesired coolant flow interactions by providing a combination of shrouding and fluid return passages within the spray module.

Although the present invention has been described in considerable detail and with reference to certain preferred versions, other versions are possible. For example, while shrouds having a conic-section or pyramid-like shape have been disclosed, it is clear that other shapes could be substituted. For example, a complex shape wrapping about several heat-producing components could be substituted. Therefore, the spirit and scope of the appended claims should not be limited to the description of the preferred versions disclosed.

In compliance with the U.S. Patent Laws, the invention has been described in language more or less specific as to methodical features. The invention is not, however, limited to the specific features described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A fluid control apparatus for controlling a coolant flow between a spray plate and a printed circuit board carrying at least one component to be cooled, the fluid control apparatus comprising:

(A) a coolant-tight spray module enclosure;

(B) a shroud having a sidewall defining a spray cavity within the coolant-tight spray module enclosure, wherein the spray cavity is sized to enclose at least one generally conical spray of coolant mist discharged by at least one atomizer defined on a surface of the spray plate;

(C) inlet passage means, defined in the shroud, for allowing vapor to enter the spray cavity for movement in a direction following the spray of coolant mist;

(D) effluent passage means, defined in the shroud, for allowing vapor and coolant to leave the spray cavity; and (E) fastening means for maintaining the shroud in a position between the spray plate and printed circuit board adjacent to the at least one component to be cooled.

2. The fluid control apparatus of claim 1, wherein the shroud is fastened to the spray plate.

3. The fluid control apparatus of claim 1, wherein the shroud is fastened to the printed circuit board.

4. A fluid control apparatus for controlling a coolant flow between a spray plate and a printed circuit board carrying at least one component and a chip carrier assembly to be cooled, the fluid control apparatus comprising:

(A) a coolant-tight spray module enclosure;

(B) a shroud having a sidewall defining a spray cavity within the coolant-tight spray module enclosure, wherein the spray cavity is sized to enclose at least one generally conical spray of coolant mist discharged by at least one atomizer defined on a surface of the spray plate;

(C) inlet passage means, defined in the shroud, for allowing vapor to enter the spray cavity for movement in a direction following the spray of coolant mist;

(D) effluent passage means, defined in the shroud, for allowing vapor and coolant to leave the spray cavity;

(E) fastening means for maintaining the shroud in a position between the spray plate and printed circuit board adjacent to the at least one component to be cooled, wherein the fastening means attaches to the chip carrier assembly; and (F) secondary shroud means, adjacent to the shroud, for directing the effluent leaving the spray cavity along a path defined between the secondary shroud means and the printed circuit board.

* * * * *